(12) United States Patent
Hayamizu et al.

(10) Patent No.: US 10,461,784 B2
(45) Date of Patent: Oct. 29, 2019

(54) COMMUNICATION APPARATUS

(71) Applicant: SOUNDPOWER CORPORATION, Fujisawa-shi, Kanagawa (JP)

(72) Inventors: Kohei Hayamizu, Mitaka (JP); Hiroaki Kobayashi, Fujisawa (JP)

(73) Assignee: SOUNDPOWER CORPORATION, Fujisawa-Shi (JP)

( * ) Notice: Subject to any disclaimer, the term of this patent is extended or adjusted under 35 U.S.C. 154(b) by 0 days.

(21) Appl. No.: 16/168,468

(22) Filed: Oct. 23, 2018

(65) Prior Publication Data
US 2019/0058496 A1 Feb. 21, 2019

Related U.S. Application Data

(63) Continuation-in-part of application No. PCT/JP2016/063205, filed on Apr. 27, 2016.

(51) Int. Cl.
*H04B 1/04* (2006.01)
*G08B 5/00* (2006.01)
*H01L 41/09* (2006.01)

(52) U.S. Cl.
CPC .................. *H04B 1/04* (2013.01); *G08B 5/00* (2013.01); *H01L 41/09* (2013.01)

(58) Field of Classification Search
CPC .......... H04B 1/04; H04B 1/06; H04B 17/104; H04B 17/13; H04W 52/42; G08B 5/00; H01L 41/09
See application file for complete search history.

(56) References Cited

U.S. PATENT DOCUMENTS

| 4,731,870 A * | 3/1988 | Black ................. H04B 7/18576 455/113 |
| 2005/0192129 A1* | 9/2005 | Kuwabara ............... H01L 41/09 473/520 |
| 2018/0167090 A1* | 6/2018 | Ishimi ..................... H04B 1/04 |

FOREIGN PATENT DOCUMENTS

| JP | 4-338079 | 11/1992 |
| JP | 2012-079667 | 4/2012 |
| JP | 2012-152346 | 8/2012 |
| JP | 2015-182548 | 10/2015 |

* cited by examiner

*Primary Examiner* — Thanh C Le
(74) *Attorney, Agent, or Firm* — Blank Rome LLP

(57) ABSTRACT

A communication apparatus 1 includes a manipulating unit 10, a power generating unit 20 that generates electric power using force externally applied via the manipulating unit 10, a transmitting unit 40 transmitting a signal, and a control unit 60 that causes, when the manipulating unit 10 is manipulated, the transmitting unit 40 to transmit the signal with priority over another process other than the transmission of the signal using first electric power which is part of the electric power generated by the power generating unit 20 and then performs the other process using second electric power other than the first electric power among the electric power generated by the power generating unit 20.

7 Claims, 3 Drawing Sheets

COMMUNICATION APPARATUS

CROSS-REFERENCE TO RELATED APPLICATIONS

This application is a continuation-in-part of International Patent Application No. PCT/JP2016/063205, filed Apr. 27, 2016, which is incorporated by reference herein in its entirety for all purposes.

TECHNICAL FIELD

The present invention relates to a communication apparatus.

BACKGROUND ART

In the past, as one of apparatuses that perform communication using electric power generated by a piezoelectric element, an apparatus including a flexible body that is supported in a cantilevered manner in a housing and includes a piezoelectric element attached thereto, a drive circuit that detects deflection caused by fluctuation vibration of the flexible body and causes a light emitting element to emit light or wirelessly transmits a signal including deflection information, and a timing pulse generation circuit that causes the drive circuit to be activated has been proposed (see, for example, Patent Document 1). With such a configuration, when an electric pulse is generated from the piezoelectric element due to the deflection of the flexible body caused by external force or vibration, it is possible to cause the drive circuit to be activated with a timing pulse generated from the timing pulse generation circuit by the generated electric pulse, cause the light emitting element to emit light by the drive circuit, and cause the signal to be wirelessly transmitted.

CITATION LIST

Patent Literature

Patent Document 1: JP-A-2012-79667

SUMMARY OF INVENTION

Problems to be Solved by Inventions

However, in the apparatus of the related art, since detailed control related to the light emission of the light emitting element and the wireless transmission of the signal by the drive circuit is not disclosed, for example, when the light emission of the light emitting element and the wireless transmission of the signal are performed at the same time or when the wireless transmission of the signal is performed after the light emission of the light emitting element is performed, the electric power generated by the piezoelectric element is consumed by the output of the light emission of the light emitting element, and the wireless transmission of the signal may be unable to be performed, and thus there is room for improvement in a viewpoint of increasing reliability of signal transmission.

The invention is made to solve the problem in the related art, and it is an object of the invention to provide a communication apparatus capable of increasing the reliability of the signal transmission.

Solutions to Solve Problems

In order to solve the aforementioned problem and to achieve the object, one aspect of the invention provides a communication apparatus, comprises manipulating means; power generating means that generates electric power using force externally applied via the manipulating means; transmitting means that transmits a signal; and control means that causes, when the manipulating means is manipulated, the transmitting means to transmit the signal with priority over another process other than the transmission of the signal using first electric power which is part of the electric power generated by the power generating means and then performs the other process using second electric power other than the first electric power among the electric power generated by the power generating means.

MODES FOR CARRYING OUT THE INVENTION

Hereinafter, an embodiment of a communication apparatus according to the invention will be described in detail with reference to the appended drawings. First, [I] Basic concept of embodiment will be described, [II] Specific content of embodiment will be then described, and [III] Modifications of embodiment will be finally described. However, the invention is not limited by the following embodiment.

[I] Basic Concept of Embodiment

First, a basic concept of an embodiment will be described. An embodiment generally relates to a communication apparatus that performs communication using electric power output from power generating means that generates electric power using force externally applied via manipulating means.

Here, the "manipulating means" is means for performing a manipulation for applying force to the power generating means, and is a concept including, for example, a press manipulating unit (for example, a press switch), a rotation manipulating unit, and the like. The "power generating means" is means for generating electric power using force externally applied via the manipulating means, and is a concept including, for example, a piezoelectric element, a dynamo, and the like. "Communication" means exchanging one-way or two-way signals, and is a concept including, for example, wired communication and wireless communication. The "communication apparatus" is an apparatus that performs communication with other apparatuses. The communication apparatus is a concept including, for example, a wired chime or a wireless chime (cordless chime) used in restaurants, hospitals, nursing home care facilities, or the like, a remote controller for manipulating a predetermined apparatus, and the like, but an embodiment will be described with an example in which the communication apparatus is a cordless chime installed in a restaurant.

[II] Specific Content of Embodiment

Figure 1:
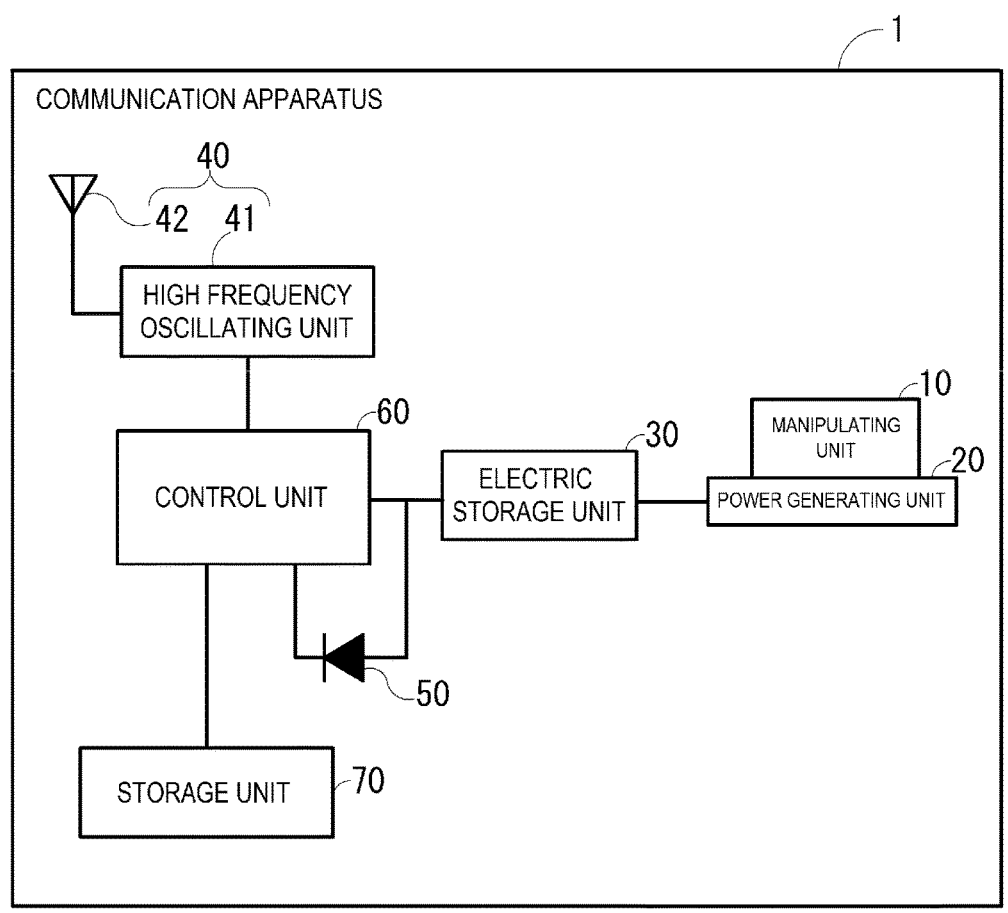
FIG. 1 is a block diagram illustrating a communication apparatus according to an embodiment of the invention.
Figure 2:
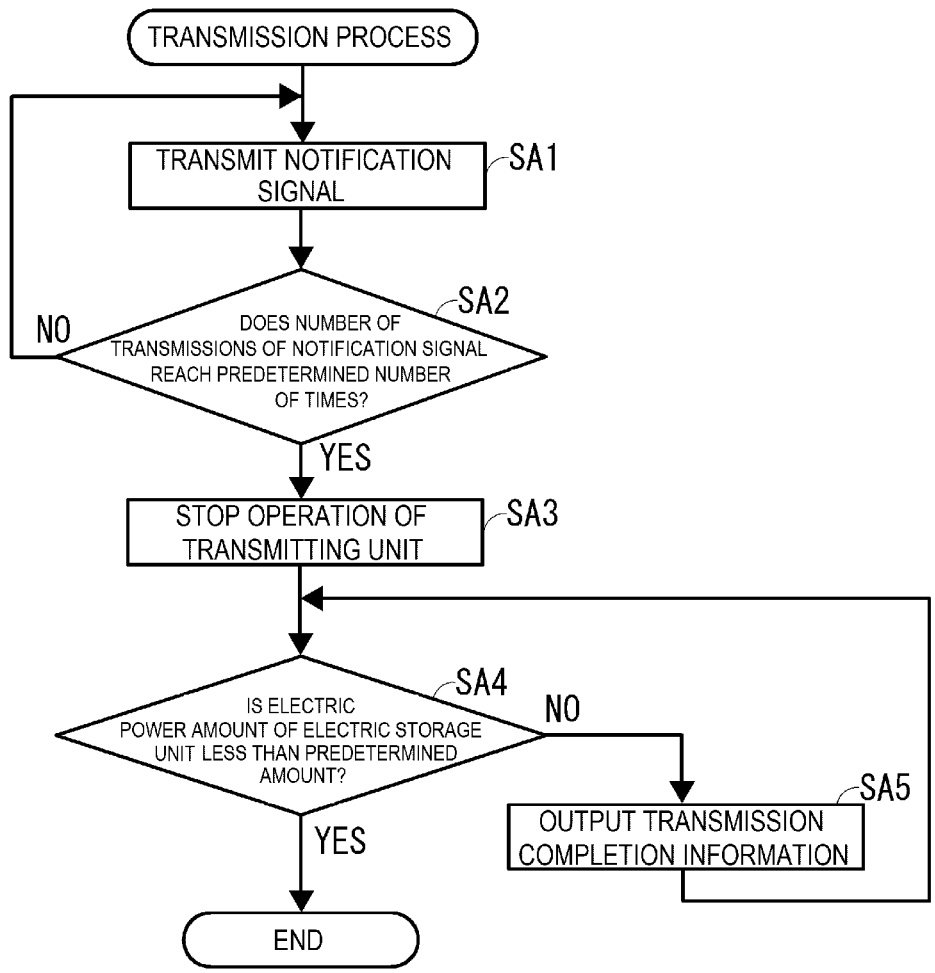
FIG. 2 is a flowchart of a transmission process.

Next, specific content of an embodiment will be described.
(Configuration)
First, a configuration of a communication apparatus according to an embodiment will be described. FIG. 1 is a block diagram illustrating a communication apparatus according to an embodiment of the invention. The communication apparatus 1 is an apparatus that performs communication with a host apparatus (not illustrated), and as illustrated in FIG. 2 includes a housing (not illustrated), a manipulating unit 10, a power generating unit 20, an electric storage unit 30, a transmitting unit 40, an output unit 50, a control unit 60, and a storage unit 70.

(Configuration—Housing)

The housing is a basic structure of the communication apparatus 1 and includes protection means for protecting the manipulating unit 10, the power generating unit 20, the electric storage unit 30, the transmitting unit 40, the output unit 50, the control unit 60, and the storage unit 70 from the outside. For example, the housing is formed of a hollow box-like body formed of a resin material such as plastic, and a lower wall of the housing is arranged to abut on an installation surface (not illustrated) (for example, an upper surface of a table). Further, a manipulation port, a transmission port, and an output port are formed in this housing (none of them are illustrated). The manipulation port is an opening for exposing a part of the manipulating unit 10 to the outside, and is arranged in any one of the side walls of the housing (for example, an upper wall of the housing). The transmission port is an opening for exposing an antenna unit 42 of the transmitting unit 40 to be described later to the outside, and is arranged in any one of the side walls of the housing (for example, a front wall of the housing). The output port is an opening for exposing a part of the output unit 50 to the outside, and is arranged in one of the side walls of the housing (for example, the upper wall of the housing).

(Configuration—Manipulating Unit)

The manipulating unit 10 is manipulating means for performing a manipulation for applying force to the power generating means. The manipulating unit 10 is constructed using, for example, a known press manipulating unit (for example, a press switch) or the like, exposed to the outside of the housing via the manipulation port, and installed so that a leading end portion of the manipulating unit 10 protrudes outward from the upper wall of the housing.

(Configuration—Power Generating Unit)

The power generating unit 20 is means for generating electric power using force externally applied via the manipulating unit 10 and includes a piezoelectric element and a vibrating plate.

(Configuration—Power Generating Unit—Piezoelectric Element)

The piezoelectric element is power generating means that is transformed by pressure and generates electricity. The piezoelectric element is a thin plate-like body, and is formed of a piezoelectric single crystal such as piezoelectric ceramics such as barium titanate or zirconia, lithium tantalate ($LiTaO_3$), or the like. However, the invention is not limited thereto, and for example, an arbitrary material capable of generating electric power by external force (including force causing distortion, bending, or compression) can be used as the piezoelectric element or instead of the piezoelectric element. As an example, an ionic polymer-metal composite material (IPMC) in which metal (gold or the like) is plated on both surfaces of a membrane (gel) of an ion conductive polymer, an ion conducting polymer gel film (ICPF), giant magnetostrictive material, an electret material, or an artificial muscle using the IPMC or the ICPF can be used.

Further, the piezoelectric element includes a plus terminal and a minus terminal (none of them are illustrated). The plus terminal and the minus terminal are output terminals for outputting an electric current generated by the piezoelectric element to the electric storage unit 30, the plus terminal is attached to one side of the piezoelectric element, and the minus terminal is attached to the other side surface of the piezoelectric element.

Further, although a specific size of the piezoelectric element is arbitrary, in an embodiment, the size of the piezoelectric element is set so that an electric power amount generated by the piezoelectric element in a case in which the press manipulation of the manipulating unit 10 is performed once is an amount that enables the transmitting unit 40 to transmit a notification signal to be described later a predetermined number of times and enables the output unit 50 to output transmission completion information to be described later for a predetermined period of time.

(Configuration—Power Generating Unit—Vibrating Plate)

The vibrating plate is a support that applies stress to the piezoelectric element and doubles as a reinforcing material for reinforcing a crack strength of the piezoelectric element. The vibrating plate is a plate-like body made of steel or the like having flexibility and durability such as a thin stainless steel plate or the like (more specifically, a plate-like body formed in the same shape with the same plate area as the piezoelectric element), arranged so that at least one side of the vibrating plate (for example, the upper surface or the lower surface of the vibrating plate) abuts on the piezoelectric element, and is bonded to the piezoelectric element by an adhesive or the like (that is, the piezoelectric element is bonded so that it becomes a unimorph type or bimorph type power generating unit).

Further, although a method of installing the power generating unit 20 configured as described above is arbitrary, for example, the power generating unit 20 is installed to be pressed and deformed by force externally applied via the manipulating unit 10. As an example, in a case in which only the entire outer edge portion of the power generating unit 20 is supported by the housing via a spacer (not illustrated), the power generating unit 20 is installed at a position at which a center portion of the upper surface of the power generating unit 20 is pressed when the manipulating unit 10 is pressed. With such an installation method, since the amount of deformation becomes maximum at the plane center position of the power generating unit 20 (the piezoelectric element), the power generation by the power generating unit 20 (the piezoelectric element) can be performed effectively.

(Configuration—Electric Storage Unit)

The electric storage unit 30 is electric storage means for storing the electric power output from the power generating unit 20 and supplying the stored electric power to the respective units of the communication apparatus 1 and is constituted by using, for example, known electric storage means such as a rechargeable battery, a battery, a condenser, or a capacitor. Further, the electric storage unit 30 includes a plus terminal and a minus terminal (none of which are illustrated). The plus terminal and the minus terminal are terminals for acquiring the electric power generated by the power generating unit 20, the plus terminal is connected to the plus terminal of the piezoelectric element via a wiring (not illustrated), and the minus terminal is connected to the minus terminal of the piezoelectric element via a wiring (not illustrated).

(Configuration—Transmitting Unit)

A transmitting unit 40 is transmitting means that transmits signal and electromagnetic wave transmitting means. The transmitting unit 40 is configured by using, for example, a known radio wave wireless transmitter, and includes a high frequency oscillating unit 41 and an antenna unit 42. Of them, the high frequency oscillating unit 41 is high frequency oscillating means that outputs a signal with a high frequency radio wave (carrier wave), and is installed near the antenna unit 42. The antenna unit 42 is radiating means that radiates (wirelessly transmits) a radio wave output from the high frequency oscillating unit 41 to the outside and is installed to be exposed to the outside of the housing via the transmission port.

(Configuration—Output Unit)

The output unit 50 is output means (display means) that outputs the transmission completion information to be described later and is alert output means (alert display means) that outputs alert information to be described later. The output unit 50 is constituted using known display means such as an LED lamp, a fluorescent lamp, or the like, and is disposed to be exposed to the outside of the housing via the output port.

(Configuration—Control Unit)

The control unit 60 is control means that controls the respective units of the communication apparatus 1 and is control means that causes, when the manipulating unit 10 is manipulated, the transmitting unit 40 to transmit a signal using first electric power to be described later with priority over another process and then performs another process using second electric power to be described later. Here, "another process" means a process other than the transmission of the signal by the transmitting unit 40, and in an embodiment, outputting the "transmission completion information" to be described later through the output unit 50 will be described as "another process." Specifically, the control unit 60 is a computer constituted by a CPU, various programs interpreted and executed on the CPU (including a basic control program such as an OS, an application program which is activated on the OS and realizes a specific function), and an internal memory such as a RAM for storing programs and various kinds of data.

Further, the control unit 60 includes an electric storage amount measuring unit and a manipulation counting unit in terms of a functional concept (none of them are illustrated). The electric storage amount measuring unit is electric storage amount measuring means that measures an electric storage amount of the electric storage unit 30. The manipulation counting unit is manipulation counting means that counts the number of manipulations of the manipulating unit 10 and measures a period of time (hereinafter referred to as a "manipulation period of time") until the number of manipulations of the manipulating unit 10 reaches a predetermined number of times to be described later (further, a default of the number of manipulations is 0, and a default value of the manipulation period of time is 0 seconds. Further, in an embodiment, the counting of the number of manipulations and the measuring of the manipulation period of time are excluded for manipulations when an alert process to be described later is activated). A process executed by the control unit 60 will be described later in detail.

(Configuration—Storage Unit)

The storage unit 70 is storage means that stores a program necessary for an operation of the communication apparatus 1 and various kinds of data. The storage unit 70 is constituted using a rewritable recording medium, and for example, a non-volatile recording medium such as a flash memory or the like can be used.

(Process)

A process executed by the communication apparatus 1 configured as described above will be described. The process executed by the communication apparatus 1 is roughly divided into a transmission process and an alert process. The transmission process and the alert process will be described below.

(Process—Transmission Process)

First, the transmission process will be described. FIG. 2 is a flowchart of the transmission process (step is abbreviated as "S" in the following description of each process). The transmission process is a process of transmitting a notification signal to be described later to a host apparatus. Although a timing to execute the transmission process is arbitrary, in an embodiment, the transmission process will be described as being activated after the power generating unit 20 generates electric power in accordance with the press manipulation of the manipulating unit 10 by the user, and the generated electric power is supplied to the transmitting unit 40, the control unit 60, and the storage unit 70 via the electric storage unit 30 (that is, after the transmitting unit 40, the control unit 60, and the storage unit 70 are powered on).

When the transmission process is activated, as illustrated in FIG. 2, in SA1, the control unit 60 first causes the transmitting unit 40 to transmit (wirelessly transmit) a notification signal to the host apparatus using part of the electric power which is stored in the electric storage unit 30 and generated by the power generating unit 20 in accordance with the press manipulation of the manipulating unit 10 (hereinafter referred to as "first electric power"). Here, the "notification signal" means a signal including notification information for notifying of calling of a clerk in a restaurant.

In SA2, the control unit 60 determines whether or not the number of transmissions of the notification signal transmitted in SA1 (specifically, the number of repetitions of SA1) reaches a predetermined number of times (for example, three times or the like). Then, when the number of transmissions is determined not to reach the predetermined number of times (SA2, No), the control unit 60 causes the process to proceed to SA1, and when the number of transmissions is determined to reach the predetermined number of times (SA2, Yes), the control unit 60 causes the process to proceed to SA3. Thereafter, in SA3, the control unit 60 causes the operation of the transmitting unit 40 to be stopped. As a result, as compared with a case in which the operation of the transmitting unit 40 is not stopped, it is possible to increase a period of time in which the transmission completion information is output in SA5 to be described later, and it is possible to reliably present the transmission completion information to the user.

In SA4, the control unit 60 determines whether or not the electric storage amount of the electric storage unit 30 is less than a predetermined amount on the basis of a measurement result of the electric storage amount measuring unit. Then, when the electric storage amount is determined to be not less than the predetermined amount (SA4, No), the control unit 60 causes the process to proceed to SA5, and when the electric storage amount is determined to be less than the predetermined amount (SA4, Yes), the control unit 60 ends the transmission process.

In SA5, the control unit 60 causes the output unit 50 to output the transmission completion information using electric power (hereinafter referred to as "second electric power") other than the first electric power among the electric power which is stored in the electric storage unit 30 and generated by the power generating unit 20 in accordance with the press manipulation of the manipulating unit 10. Here, the "transmission completion information" is information indicating that the transmission of the notification signal by the transmitting unit 40 is completed. Further, although a method of outputting the transmission completion information is arbitrary, in an embodiment, the transmission completion information is output such that the output unit 50 performs lighting display or blinking display. Thereafter, the control unit 60 causes the process to proceed to SA4. Accordingly, when the electric storage amount of the electric storage unit 30 is the predetermined amount or more, it is possible to cause the output unit 50 to output the transmission completion information continuously.

With the transmission process as described above, it is possible to perform the transmission of the notification signal in SA1 with priority over the output of the transmission completion information in SA5, and thus as compared with the case in which the transmission of the notification signal and the output of the transmission completion information are performed at the same time, it is possible to prevent a situation in which the electric power generated by the power generating unit 20 is consumed by the output of the transmission completion information, so that the notification signal is unable to be transmitted (in particular, it is effective since the wireless transmission is relatively large in power consumption). Therefore, the notification signal can reliably be transmitted, and the reliability of the transmission of the notification signal can be enhanced. Further, since the transmission completion information can be presented to the user in SA5, it is possible to prevent the user from performing a useless manipulation on the manipulating unit 10 after the transmission of the notification signal is completed.

(Processing—Alert Process)

Figure 3:
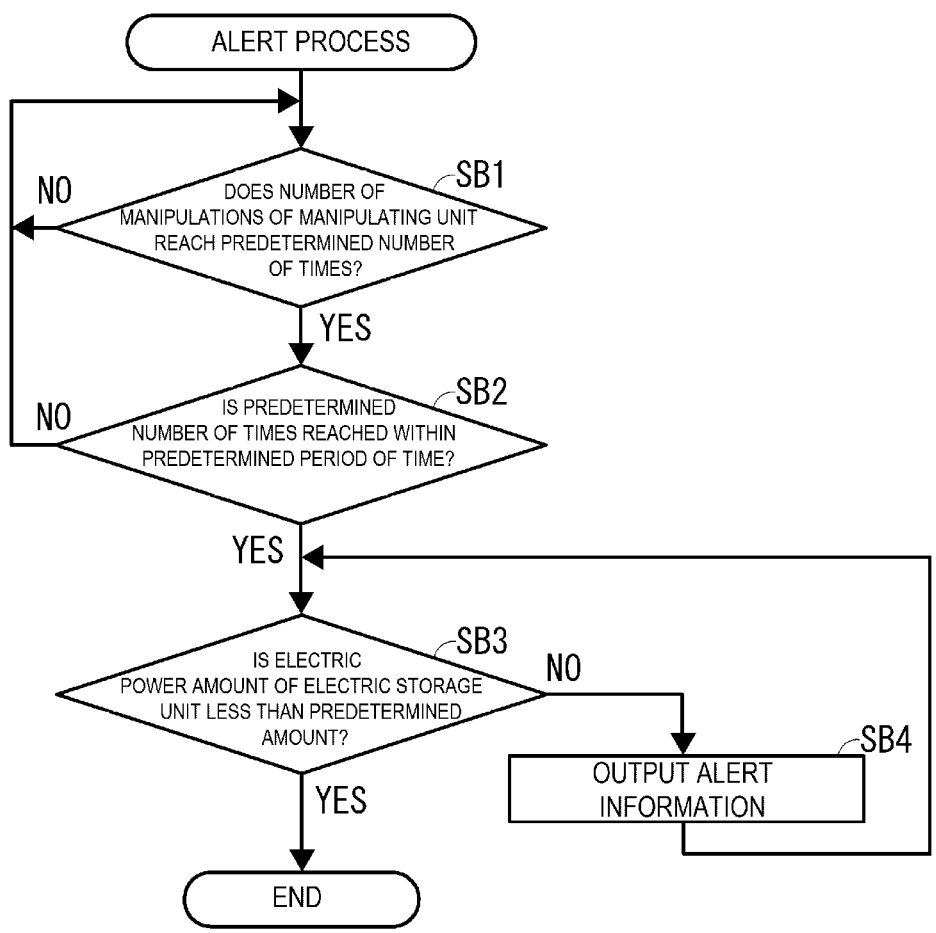
FIG. 3 is a flowchart

Next, the alert process will be described. FIG. 3 is a flowchart of the alert process. The alert process is a process of outputting alert information to be described later. Although a timing to execute the alert process is arbitrary, in an embodiment, the alert process is activated and executed in parallel with the transmission process after the power generating unit 20 generates electric power in accordance with the press manipulation of the manipulating unit 10 by the user, and the generated electric power is supplied to the transmitting unit 40, the control unit 60, and the storage unit 70 via the electric storage unit 30. Further, in an embodiment, it is assumed that, when the transmission process ends while SB1 to SB4 of the alert process to be described later are being performed, the alert process ends as well.

When the alert process is activated, as illustrated in FIG. 3, in SB1, the control unit 60 first determines whether or not the number of manipulations of the manipulating unit 10 reaches a predetermined number of times (for example, 5 times or the like) on the basis of the count result of the manipulation counting unit. Then, the control unit 60 is on standby until the number of manipulations is determined to reach the predetermined number of times (SB1, No) and when the number of manipulations is determined to reach the predetermined number of times (SB1, Yes), the control unit 60 causes the process to proceed to SB2.

In SB2, the control unit 60 determines whether or not the manipulation period of time is within a predetermined period of time (for example, within 5 seconds) on the basis of the count result of the manipulation counting unit. Then, when the manipulation period of time is determined not to be within the predetermined period of time (SB2, No), the control unit 60 causes the process to proceed to SB1, and when the manipulation period of time is determined to be within the predetermined period of time (SB2, Yes), the control unit 60 causes the process to proceed to SB3. In an embodiment, when the process proceeds to SB1, the count result by manipulation counting unit until now (the number of manipulations and the manipulation period of time) is reset to a default value.

In SB3, the control unit 60 determines whether or not the electric storage amount of the electric storage unit 30 is less than a predetermined amount on the basis of the measurement result of the electric storage amount measuring unit. Then, when the electric storage amount is determined not to reach the predetermined amount (SB3, No), the control unit 60 proceeds to SB4, and when the electric storage amount is determined to reach the predetermined amount (SB3, Yes), the control unit 60 ends the alert process.

In SB4, the control unit 60 causes the output unit 50 to output alert information. Here, the "alert information" is information indicating that the manipulation of the manipulating unit 10 is stopped. Although a method of outputting the alert information is arbitrary, in an embodiment, the alert information is output in a form different from the output of the transmission completion information so that the alert information can be output so as to be distinguishable from the transmission completion information. Specifically, when the transmission completion information by the output unit 50 is the lighting display, blinking display is performed as display of the alert information by the output unit 50. Further, when the transmission completion information by the output unit 50 is the blinking display, the lighting display or the blinking display at time intervals different from those of the transmission completion information is performed as the display of the alert information by the output unit 50. Thereafter, the control unit 60 causes the process to proceed to SB3. Accordingly, when the electric storage amount of the electric storage unit 30 is the predetermined amount or more, it is possible to cause the output unit 50 to output the alert information continuously.

As described above, since the alert process is executed in parallel with the transmission process, for example, when the electric storage amount is determined not to reach the predetermined amount in SB3 while SA5 of the transmission process is being executed, SB4 is executed. In other words, it is assumed that the output of the transmission completion information and the output of the alert information overlap. In this case, for example, the transmission completion information and the alert information are alternately displayed by the output unit 50 using the second electric power so that both the transmission completion information and the alert information can be presented to the user, or the alert information may be displayed after the transmission completion information is displayed for a predetermined period of time by the output unit 50.

Since the alert information can be presented to the user through the alert process, it is possible to inform the user that the user manipulates the manipulating unit 10 unnecessarily.

Effects of Embodiment

As described above, according to an embodiment, since the control unit 60 that causes, when the manipulating unit 10 is manipulated, the transmitting unit 40 to transmit a signal using the first electric power with priority over another process other than transmission of a signal and then performs another process using the second electric power is provided, it is possible to perform the transmission of the signal with priority over another process, and thus as compared with the case where the transmission of the signal and another process are performed at the same time, it is possible to prevent a situation in which the electric power generated by the power generating unit 20 is consumed by the output of the transmission completion information, so that the signal is unable to be transmitted. Therefore, it is possible to reliably transmit the signal and improve the reliability of the transmission of the signal.

Further, since another process includes causing the output unit 50 to output the transmission completion information, the transmission completion information can be presented to the user, and thus it is possible to prevent the user from performing a useless manipulation on the manipulating unit 10 after the transmission of the signal is completed.

Further, since the output unit 50 includes display means for displaying the transmission completion information, the transmission completion information can be visually presented to the user, and the user can transmit the transmission completion information easily and reliably.

Further, when the manipulating unit 10 is manipulated a predetermined number of times or more within a predetermined period of time, the control unit 60 causes the output unit 50 to output the alert information indicating that the manipulation of the manipulating unit 10 is stopped, and the alert information can be presented to the user, and thus it is possible to inform the user that the user manipulates the manipulating unit 10 unnecessarily.

Further, since the output unit 50 includes the alert display means for displaying the alert information, the alert information can be visually presented to the user, and the user can transmit the alert information easily and reliably.

Further, since the control unit 60 causes the operation of the transmitting unit 40 to be stopped or causes power supply from the power generating unit 20 to the transmitting unit 40 to be stopped after causing the transmitting unit 40 to transmit the signal, as compared with a case in which the operation of the transmitting unit 40 is not stopped or a case in which the power supply to the transmitting unit 40 is not stopped, it is possible to increase a period of time in which another process is performed, and it is possible to execute another process reliably.

Further, since the transmitting unit 40 includes the electromagnetic wave transmitting means that transmits the signal with the electromagnetic wave, the signal can be transmitted without using a communication cable, and thus it is possible to improve an installation property of the communication apparatus 1.

[III] Modifications of Embodiment

Although the embodiment of the invention has been described above, a specific configuration and means of the invention can be arbitrarily modified or improved within the scope of the technical spirit of inventions set forth in claims. Such modifications will be described below.

Problems to be Solved and Effects of Invention

First, the problems to be solved by the invention and the effects of the invention are not limited to content described above, and according to the invention, it is possible to solve a problem not described above or obtain an effect not described above, and only some of the problems described above may be solved, or only some of the effects described above may be shown. For example, although the usability of the communication apparatus 1 according to the invention is about the same as the related art, when the same usability as the related art can be secured with a structure different from the related art, the problems of the invention are solved.
(Shape, Numerical Value, Structure, and Time Series)

For the components exemplified in an embodiment or the drawings, a shape, a numerical value, or a structural correlation or a time-series correlation of a plurality of components can be arbitrarily modified or improved within the scope of the technical spirit of the invention.
(Communication Apparatus)

In the above embodiment, the communication apparatus 1 has been described as being applied to the cordless chime, but the invention is not limited thereto. For example, the communication apparatus 1 may be applied to a lever, a knob, or a handle attached to a door or the like. Further, the communication apparatus 1 may be applied to a remote control for remotely controlling a predetermined apparatus. In this case, when the manipulating unit 10 is manipulated, an instruction signal to instruct a predetermined apparatus to execute a predetermined operation is transmitted from the transmitting unit 40. Further, the communication apparatus 1 may also be applied to tools, furniture, or the like which can generate electric power in accordance with a manipulation which is not intended by a manipulator, and as an example, the communication apparatus 1 may be applied to a seat of each of a plurality of chairs installed in a region in which air conditioning management is performed by an air conditioning system. In this case, a control unit of the air conditioning system may perform an air conditioning process or the like on the basis of the notification signal received from the communication apparatus 1 (for example, as the number of received notification signals increases, the control unit of the air conditioning system performs control such that wind force is increased). Further, since the transmission completion information output in SA5 of the transmission process can be presented to an administrator or the like of the air conditioning system, the administrator can accurately check whether or not the transmission of the notification signal is complete.

In the above embodiment, the communication apparatus 1 has been described as being installed so that the lower wall of the housing abuts on the upper surface of the table, but the invention is not limited thereto. For example, the communication apparatus 1 may be installed such that the rear surface wall of the housing abuts on a wall surface of a building, or the lower wall of the housing abuts on a floor surface of the building.
(Power Generating Unit)

In the above embodiment, the communication apparatus 1 has been described as having a single power generating unit 20, but the invention is not limited thereto, and for example, in order to increase the generated electric power amount, a plurality of power generating units 20 may be installed.

In the above embodiment, the power generating unit 20 has been described as including the piezoelectric element and the vibrating plate, but the invention is not limited thereto, and for example, a dynamo may be installed instead of the piezoelectric element and the vibrating plate. In this case, the manipulating unit 10 is constituted a manipulating unit capable of applying rotational force to the dynamo (for example, a known rotation manipulating unit, or the like).
(Electric Storage Unit)

In the above embodiment, the communication apparatus 1 has been described as including a single electric storage unit 30, but the invention is not limited thereto, and for example, the communication apparatus 1 may include a first electric storage unit for storing the first electric power and a second electric storage unit for storing the second electric power.
(Transmitting Unit)

In the above embodiment, the transmitting unit 40 has been described as being constituted using the radio wave wireless transmission device, but the invention is not limited thereto. For example, when the communication apparatus 1 is installed in an environment in which a radio disturbance is likely to occur, the transmitting unit 40 may be constituted using a wireless transmitter which can transmit signals with electromagnetic waves other than radio waves (as an example, an infrared type wireless transmitter or the like). Alternatively, the transmitting unit 40 may be constituted using a wireless transmission unit (ultrasonic transmitting means) capable of transmitting a signal with an ultrasonic wave so that a signal can be transmitted by a method other than electromagnetic waves or may be constituted using a wired transmitter.

(Output Unit)

In the above embodiment, the output unit 50 has been described as being constituted using the display means, but the invention is not limited thereto. For example, the output unit 50 may be constituted using audio output means (an alert sound output means) such as a speaker that outputs the transmission completion information by voice instead of the display means. Accordingly, in the transmission process and the alert process, the transmission completion information and the alert information can be presented to the user by voice, and even when the user is at a position in which it is difficult to see the communication apparatus 1, the user can understand the transmission completion information and the alert information. Alternatively, the output unit 50 may be constituted using both the display means and the audio output means. Accordingly, it is easier to understand the transmission completion information and the alert information as compared with the case in which the output unit 50 is constituted using only one of the display means and the audio output means. Further, as a method of outputting the transmission completion information and the alert information by voice, it is desirable that the transmission completion information and the alert information are output in different forms, and as an example, when an audio output of the transmission completion information by the speaker is outputting a sound such as "beep, beep" consecutively, a sound "beep, beep" may be intermittently output at predetermined time intervals (for example, intervals of 3 seconds or the like) as an audio output of the alert information by the speaker.

Further, in the above embodiment, the output unit 50 has been described as one in which the output means and the alert output means are integrally formed, but the invention is not limited thereto, and for example, the output means and the alert output means may be separately formed.

(Another Process)

In the above embodiment, another process has been described as the process of causing the output unit to output the transmission completion information, but the invention is not limited thereto. For example, another process may be a process of causing receiving means installed in a notification apparatus to receive a confirmation signal indicating that the notification signal transmitted by the transmitting unit 40 has been received using the second electric power instead of the output of the transmission completion information so that it is possible to determine whether or not the transmitted signal has been received. Alternatively, the output of the transmission completion information and the reception of the confirmation signal may be combined using the second electric power. In this case, the reception of the confirmation signal may be performed with a priority over the output of the transmission completion information, or the output of the transmission completion information may be performed with a priority over the reception of the confirmation signal. With such a process, for example, when the confirmation signal is unable to be received within a predetermined period of time after the signal is transmitted, since the signal can be transmitted again, the reliability of the signal transmission can be further enhanced.

(Transmission Process)

In the above embodiment, the transmission of the notification signal has been described as being started each time the press manipulation of the manipulating unit 10 is performed in SA1, but the invention is not limited thereto. For example, when the press manipulation of the manipulating unit 10 is performed within a predetermined period of time a predetermined number of times or less (as an example, twice or less within 2 seconds or the like), the transmission of the notification signal may be started.

Further, in the above embodiment, the operation of the transmitting unit 40 and the supply of the electric power to the transmitting unit 40 have been described as being consecutively performed in SA1 and SA2, but the invention is not limited thereto, and for example, the operation of the transmitting unit 40 and the power supply to the transmitting unit 40 may be intermittently performed in order to suppress the consumption of the electric power generated by the power generating unit 20. As an example, first, after the process of SA1, the operation of transmitting unit 40 (or the power supply to the transmitting unit 40) is stopped. Then, in SA2, the number of transmissions is determined not to reach the predetermined number of times, the operation of transmitting unit 40 (or the power supply to the transmitting unit 40) is restored after a predetermined period of time elapses since the operation of the transmitting unit 40 is stopped, and the process of SA1 is resumed. Then, a series of processes described above are repeated until it is determined in SA2 that the number of transmissions reaches a predetermined number of times. Further, the "predetermined period of time" is a concept including, for example, a period of time or the like decided in advance on a receiving side (host apparatus side) and may be set within a range of several milliseconds to several seconds as an example.

Further, in the above embodiment, the process of SA3 has been described as being performed, but the invention is not limited thereto, and for example, the process of SA3 may be omitted in order to reduce the processing load of the control unit 60. In the above embodiment, the operation of the transmitting unit 40 has been described as being stopped in SA3, but the invention is not limited thereto, and for example, the power supply to the transmitting unit 40 may be stopped or both of them are performed.

Further, in the above embodiment, the process of SA5 has been described as being performed continuously until it is determined in SA4 that the electric storage amount is less than a predetermined amount, but the invention is not limited thereto. For example, in order to suppress the consumption of the electric power generated by the power generating unit 20, the operation of the output unit 50 may be stopped, the power supply to the output unit 50 may be stopped, or both of them may be performed.

(Alert Process)

In the above embodiment, the alert process has been described as being performed, but the invention is not limited thereto, and for example, the alert process may be omitted in order to reduce the processing load of the control unit 60.

(Notes)

The notes as the above-mentioned embodiments are described in below.

A communication apparatus in note 1 comprises manipulating means; power generating means that generates electric power using force externally applied via the manipulating means; transmitting means that transmits a signal; and control means that causes, when the manipulating means is manipulated, the transmitting means to transmit the signal with priority over another process other than the transmission of the signal using first electric power which is part of the electric power generated by the power generating means and then performs the other process using second electric power other than the first electric power among the electric power generated by the power generating means.

The communication apparatus in note 2 is the communication apparatus according to note 1, wherein the other process includes causing the output means to output transmission completion information or causing receiving means to receive a confirmation signal indicating that the signal transmitted by the transmitting means is received.

Moreover, the communication apparatus described in note 3 is the communication apparatus according to note 2, wherein the output means includes display means that displays the transmission completion information or audio output means that outputs the transmission completion information by voice.

Moreover, the communication apparatus described in note 4 is the communication apparatus according to any one of notes 1 to 3, wherein the control means causes alert output means to output alert information indicating that the manipulation of the manipulating means is stopped when the manipulating means is manipulated a predetermined number of times or more within a predetermined period of time.

Moreover, the communication apparatus described in note 5 is the communication apparatus according to note 4, wherein the alert output means includes alert display means that displays the alert information or alert audio output means that outputs the alert information by voice.

Moreover, the communication apparatus described in note 6 is the communication apparatus according to any one of notes 1 to 5, wherein the control means causes an operation of the transmitting means to be stopped or causes power supply to the transmitting means by the power generating means to be stopped after causing the transmitting means to transmit the signal.

Moreover, the communication apparatus described in note 7 is the communication apparatus according to any one of notes 1 to 6, wherein the transmitting means includes electromagnetic wave transmitting means that transmits the signal with an electromagnetic wave or ultrasonic transmitting means that transmits the signal with a sound wave or an ultrasonic wave.

Advantageous Effect of Notes

The advantageous effect of notes as advantageous effect of the above-mentioned embodiments are described in below.

According to the communication apparatus described in note 1, since the control means that causes, when the manipulating means is manipulated, the transmitting means to transmit a signal using the first electric power with priority over another process other than transmission of a signal and then performs another process using the second electric power is provided, it is possible to perform the transmission of the signal with priority over another process, and thus as compared with the case where the transmission of the signal and another process are performed at the same time, it is possible to prevent a situation in which the electric power generated by the power generating means is consumed by the output of the transmission completion information, so that the signal is unable to be transmitted. Therefore, it is possible to reliably transmit the signal and improve the reliability of the transmission of the signal.

According to the power generation device described in note 2, since another process includes causing the output means to output the transmission completion information, the transmission completion information can be presented to the user, and thus it is possible to prevent the user from performing a useless manipulation on the manipulating means after the transmission of the signal is completed. Further, since another process includes causing receiving means to receive a confirmation signal indicating that the signal transmitted by the transmitting means is received, it is possible to determine whether or not the transmitted signal has been received. Accordingly, for example, when the confirmation signal is unable to be received within a predetermined period of time after the signal is transmitted, since the signal can be transmitted again, the reliability of the signal transmission can be further enhanced.

According to the power generation device described in note 3, since the output means includes display means for displaying the transmission completion information, the transmission completion information can be visually presented to the user, and the user can transmit the transmission completion information easily and reliably. Further, since the output means includes audio output means that outputs the transmission completion information by voice, the transmission completion information can be presented to the user by voice, and even when the user is at a position in which it is difficult to see the communication apparatus, the user can understand the transmission completion information.

According to the power generation device described in note 4, when the manipulating means is manipulated a predetermined number of times or more within a predetermined period of time, the control means causes the output means to output the alert information indicating that the manipulation of the manipulating means is stopped, and the alert information can be presented to the user, and thus it is possible to inform the user that the user manipulates the manipulating means unnecessarily.

According to the power generation device described in note 5, since the output means includes the alert display means for displaying the alert information, the alert information can be visually presented to the user, and the user can transmit the alert information easily and reliably. Further, since the alert output means includes alert audio output means that outputs the alert information by voice, the alert information can be presented to the user by voice, and even when the user is at a position in which it is difficult to see the communication apparatus, the user can understand the alert information.

According to the power generation device described in note 6, since the control means causes the operation of the transmitting means to be stopped or causes power supply from the power generating means to the transmitting means to be stopped after causing the transmitting means to transmit the signal, as compared with a case in which the operation of the transmitting means is not stopped or a case in which the power supply to the transmitting means is not stopped, it is possible to increase a period of time in which another process is performed, and it is possible to execute another process reliably.

According to the power generation device described in note 7, since the the transmitting means includes electromagnetic wave transmitting means that transmits the signal with an electromagnetic wave or ultrasonic transmitting means that transmits the signal with a sound wave or an ultrasonic wave, the signal can be transmitted without using a communication cable, and thus it is possible to improve an installation property of the communication apparatus.

REFERENCE NUMERALS

1 Communication apparatus
10 Manipulating unit
20 Power generating unit
30 Electric storage unit
40 Transmitting unit
41 High frequency oscillating unit
42 Antenna unit
50 Output unit
60 Control unit
70 Storage unit

The invention claimed is:

1. A communication apparatus, comprising:
at least one manipulating unit;
at least one power generating unit that generates electric power using force externally applied via the manipulating unit;
at least one transmitting unit that transmits a signal; and
at least one control unit that causes, when the manipulating unit is manipulated, the transmitting unit to transmit the signal with priority over another process other than the transmission of the signal using first electric power which is part of the electric power generated by the power generating unit and then performs the other process using second electric power other than the first electric power among the electric power generated by the power generating unit.

2. The communication apparatus according to claim 1, wherein the other process includes causing at least one output unit to output transmission completion information or causing at least one receiving unit to receive a confirmation signal indicating that the signal transmitted by the transmitting unit is received.

3. The communication apparatus according to claim 2, wherein the output unit includes at least one display unit that displays the transmission completion information or audio output unit that outputs the transmission completion information by voice.

4. The communication apparatus according to claim 1, wherein the control unit causes alert output unit to output alert information indicating that the manipulation of the manipulating unit is stopped when the manipulating unit is manipulated a predetermined number of times or more within a predetermined period of time.

5. The communication apparatus according to claim 4, wherein the alert output unit includes at least one alert display unit that displays the alert information or alert audio output unit that outputs the alert information by voice.

6. The communication apparatus according to claim 1, wherein the control unit causes an operation of the transmitting unit to be stopped or causes power supply to the transmitting unit by the power generating unit to be stopped after causing the transmitting unit to transmit the signal.

7. The communication apparatus according to claim 1, wherein the transmitting unit includes electromagnetic wave transmitting unit that transmits the signal with an electromagnetic wave or ultrasonic transmitting unit that transmits the signal with a sound wave or an ultrasonic wave.

* * * * *